(12) United States Patent
Mednik et al.

(10) Patent No.: US 9,658,276 B2
(45) Date of Patent: May 23, 2017

(54) CIRCUIT AND METHOD FOR DETECTING SHORT CIRCUIT FAILURE OF A SWITCHING TRANSISTOR

(71) Applicant: Microchip Technology Inc., Chandler, AZ (US)

(72) Inventors: Alexander Mednik, Campbell, CA (US); Rohit Tirumala, Sunnyvale, CA (US); Marc Tan, Sunnyvale, CA (US); Simon Krugly, San Jose, CA (US)

(73) Assignee: Microchip Technology Inc., Chandler, AZ (US)

( * ) Notice: Subject to any disclaimer, the term of this patent is extended or adjusted under 35 U.S.C. 154(b) by 138 days.

(21) Appl. No.: 14/743,945

(22) Filed: Jun. 18, 2015

(65) Prior Publication Data

US 2015/0369854 A1 Dec. 24, 2015

Related U.S. Application Data

(60) Provisional application No. 62/016,090, filed on Jun. 23, 2014.

(51) Int. Cl.
| | |
|---|---|
| G01R 31/26 | (2014.01) |
| G01R 31/02 | (2006.01) |
| H02H 3/04 | (2006.01) |
| H02H 3/08 | (2006.01) |
| H02H 3/093 | (2006.01) |

(52) U.S. Cl.
CPC ....... *G01R 31/2621* (2013.01); *G01R 31/025* (2013.01); *H02H 3/044* (2013.01); *H02H 3/08* (2013.01); *H02H 3/093* (2013.01)

(58) Field of Classification Search
CPC  G01R 31/06; G01R 31/3274; G01R 31/2621; H01L 27/14843; G01N 24/08
USPC .......... 324/600, 762.09, 606, 647, 656, 665, 324/672, 679, 705, 76.11, 76.52, 76.77
See application file for complete search history.

(56) References Cited

U.S. PATENT DOCUMENTS

| | | | | |
|---|---|---|---|---|
| 5,917,292 | A * | 6/1999 | Marsanne | H04N 3/24 315/384 |
| 6,185,082 | B1 * | 2/2001 | Yang | H02M 1/32 323/285 |
| 2014/0077782 | A1 * | 3/2014 | Cortigiani | H03K 17/0822 323/284 |
| 2015/0372678 | A1 * | 12/2015 | Zhang | H03K 19/017509 327/109 |

* cited by examiner

*Primary Examiner* — Melissa Koval
*Assistant Examiner* — Trung Nguyen
(74) *Attorney, Agent, or Firm* — DLA Piper LLP (US)

(57) ABSTRACT

A circuit and method are provided detecting a persistent short circuit in a power MOSFET for the purpose of protecting a load from over-current.

10 Claims, 3 Drawing Sheets

CIRCUIT AND METHOD FOR DETECTING SHORT CIRCUIT FAILURE OF A SWITCHING TRANSISTOR

CROSS REFERENCE TO RELATED APPLICATION

This patent application claims priority to U.S. Provisional Application No. 62/016,090, filed on Jun. 23, 2014, and titled "Circuit and Method for Detecting Short Circuit Failure of a Switching Transistor," which is incorporated herein by reference in its entirety.

TECHNICAL FIELD

A circuit and method are provided detecting a persistent short circuit in a power MOSFET for the purpose of protecting a load from over-current.

BACKGROUND OF THE INVENTION

FIG. 1 depicts a prior art protection circuit 100 for protecting a load 110 from over-current stress due to a short-circuit failure 199 of a transistor 102, the protection circuit 100 comprising a current sense resistor 103 and a circuit breaker 106. The load 110 receives power from an input source of voltage 101 through the transistor 102 biased into conduction by a driver 105. In operation, when a voltage threshold is exceeded across the sense resistor 103, the circuit breaker 106 disconnects the load 110 from the input voltage source 103.

The prior art protection circuit 100 suffers high cost of components and is not well suited for integration in a monolithic die with the driver 105. In addition, circuit breaker 106 does not provide adequate protection in a system with low headroom voltage.

What is needed is an improved circuit and method for performing direct detection of the transistor failure.

SUMMARY OF THE INVENTION

The present invention proposes a method and circuit for detecting a short circuit failure of a switching transistor adapted for connecting a load to an input source of voltage, the method comprising: a step of detecting an over-current condition at the load; a step of biasing the switching transistor non-conductive when the over-current condition is detected; a step of a blanking delay to allow the over-current condition to clear; a step of reporting a fault status in the case of the over-current condition persisting past the blanking delay.

DETAILED DESCRIPTION OF THE PREFERRED EMBODIMENT

Figure 1:
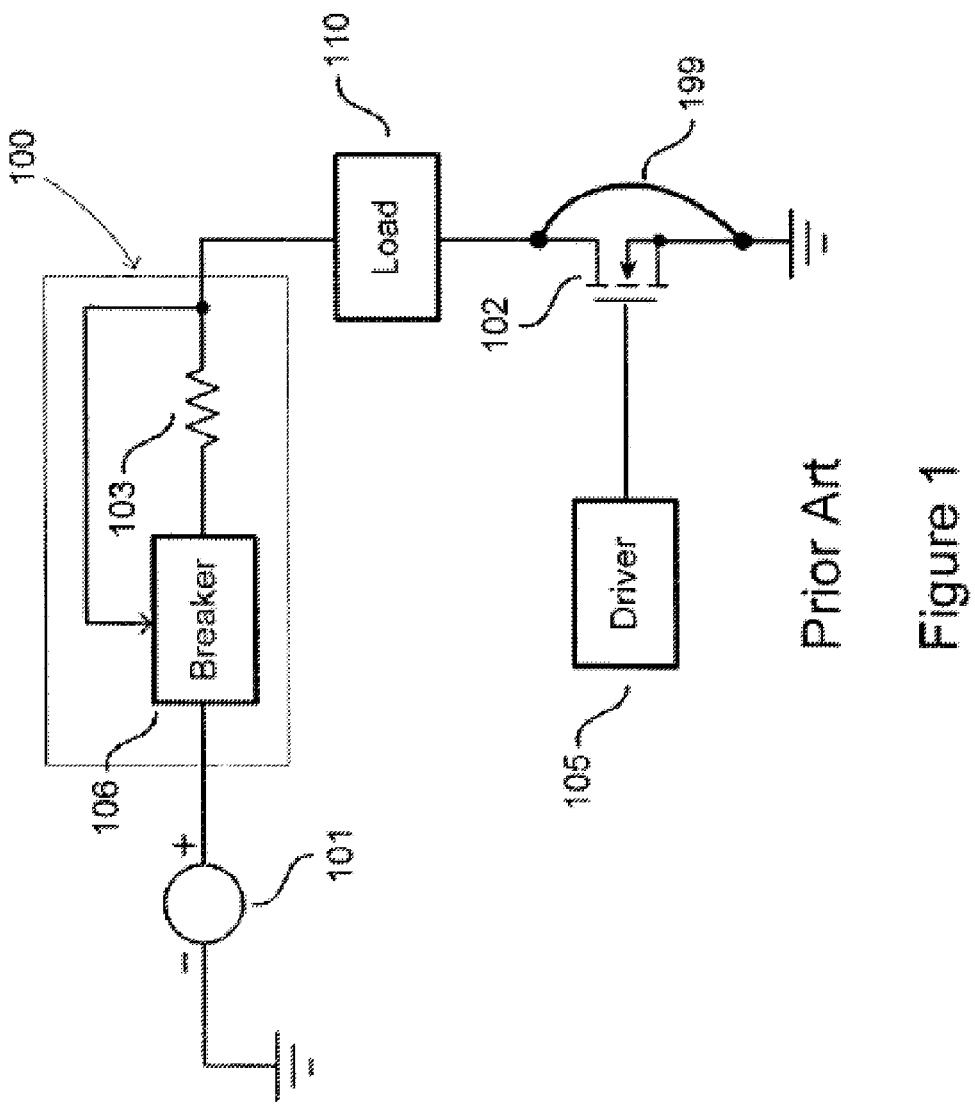
FIG. 1 depicts a prior art protection circuit.
Figure 2:
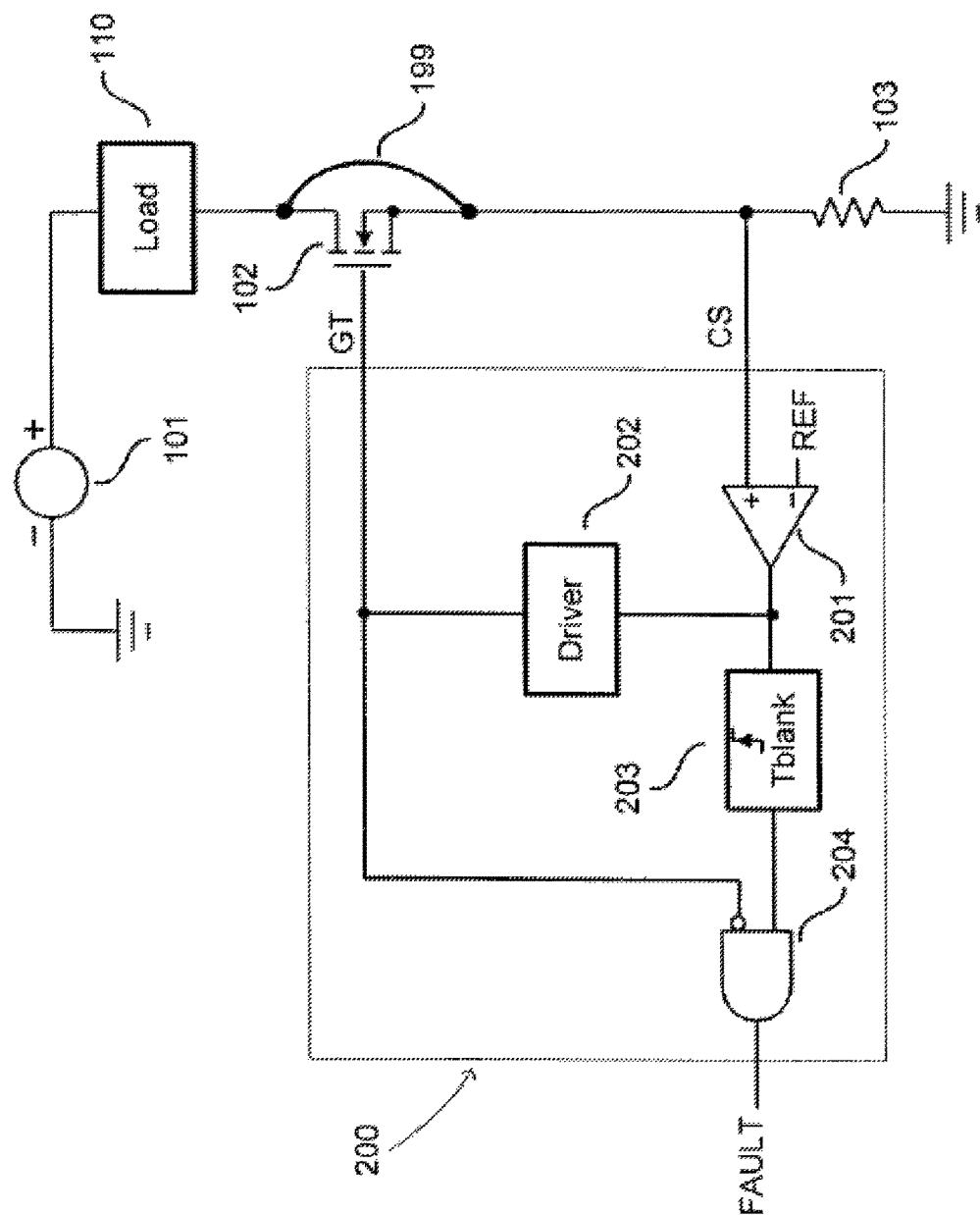
FIG. 2 depicts one embodiment of a protection circuit according to the present invention.

FIG. 2 depicts a detection circuit 200 of the present invention for detecting the short-circuit failure 199 of the transistor 102, the circuit 200 comprising: a current sense input CS; a driver output GT; a flag output FAULT; a comparator 201 for comparing voltage at CS to a reference REF and reporting a comparison result at an output; a driver 202 for biasing the transistor 102 non-conductive when voltage at CS exceeds REF; a circuit 203 for generating a blanking delay at the output of the comparator 201 for allowing the over-current condition to clear; a gate 204 reporting the short-circuit failure 199 at the flag output FAULT when the condition of the CS voltage exceeding REF persists past the blanking delay generated by circuit 203. Thus, when the flag output FAULT is asserted, a short-circuit failure 199 has occurred. The system can take appropriate steps in response to short-circuit failure 199. For example, the system can disable input source of voltage 101 or can disconnect load 110 from input source of voltage 101.

Figure 3:
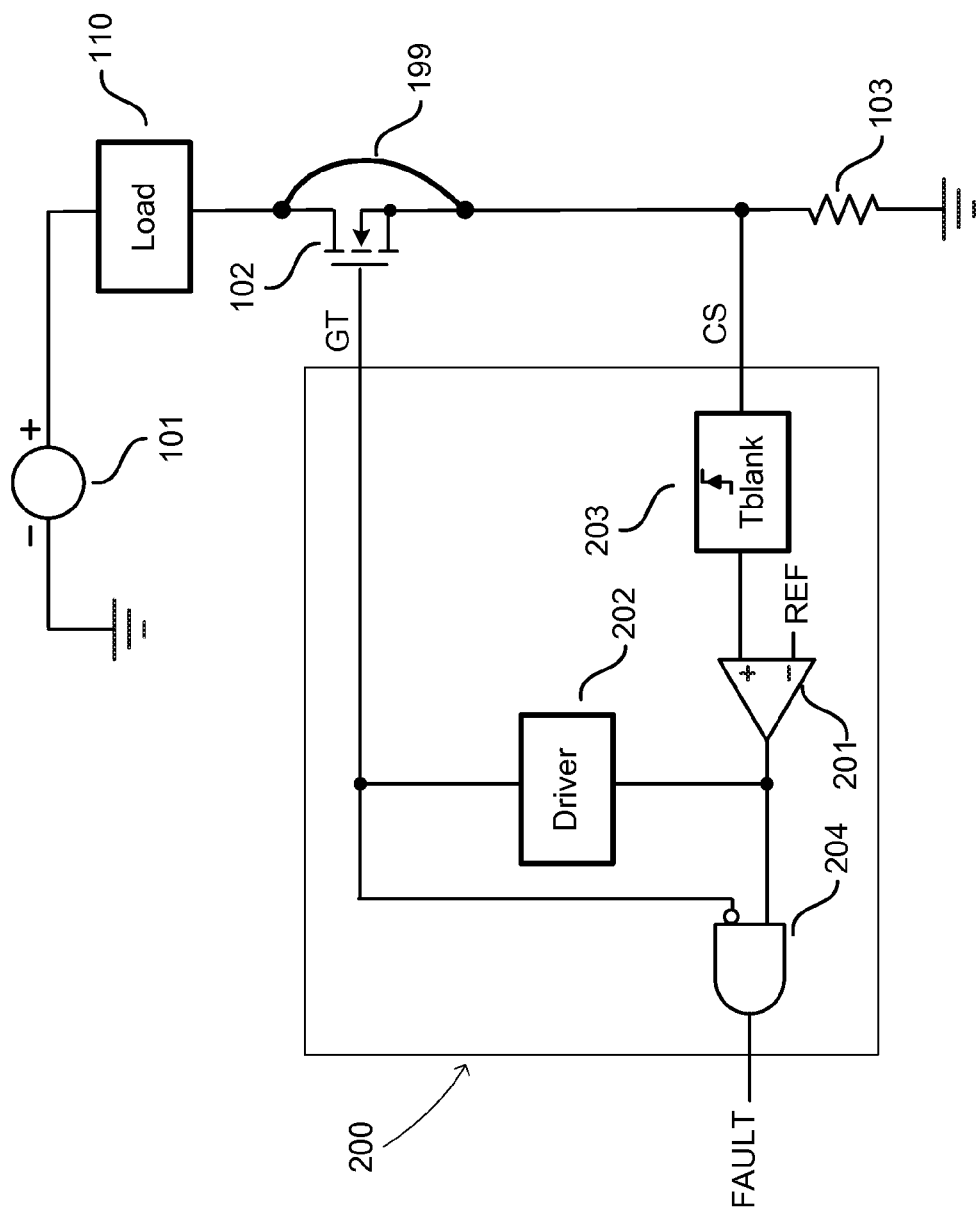
FIG. 3 depicts another embodiment of a protection circuit according to the present invention.

FIG. 3 depicts the detection circuit 200 of FIG. 2, wherein a circuit 203 generates a blanking delay at the current sense input CS allowing the over-current condition to clear before the voltage at CS propagates to the comparator 201.

What is claimed is:

1. A method of determining a fault condition in a circuit, comprising:
    comparing a voltage at a current sense element with a reference voltage; and
    if the voltage at the current sense element exceeds the reference voltage, turning off a switch comprising a gate and a first terminal and a second terminal, the first terminal coupled to a load and the second terminal coupled to the current sense element; and
    after a predetermined period of time after the turning off of the switch, if the voltage at the current sense element exceeds the reference voltage, asserting a signal indicating a fault.

2. The method of claim 1, wherein the fault condition is a short circuit failure of the switch.

3. A protection circuit, comprising:
    a switching transistor having a first terminal, a second terminal, and a gate;
    a current sense element coupled to the switching transistor;
    a comparator with a first input terminal, a second input terminal, and an output, the first input terminal coupled the current sense element and the second input terminal coupled to a reference voltage, wherein the output indicates whether the voltage of the current sense element exceeds the reference voltage;
    a gate driver with an input coupled to the output of the comparator and with an output coupled to the gate of the transistor, wherein the output of the gate driver turns on the transistor during normal operation and turns off the transistor during a mode to determine whether a fault exists in the transistor;
    a blanking circuit for generating a blanking delay of a predetermined time period, the blanking circuit having an input coupled to the output of the comparator and an output; and
    a logic gate for receiving the output of the blanking circuit and the output of the gate driver, wherein the logic gate outputs a signal indicating a fault condition in the transistor.

4. The circuit of claim 3, wherein the fault condition is a short circuit failure of the transistor.

5. The protection circuit of claim 3, wherein the logic gate is an AND gate comprising:
    an inverting input for receiving the output of the gate driver; and
    a non-inverting input for receiving the output of the blanking circuit.

6. The protection circuit of claim 4, wherein the logic gate is an AND gate comprising:
   an inverting input for receiving the output of the gate driver; and
   a non-inverting input for receiving the output of the blanking circuit.

7. A protection circuit, comprising:
   a switching transistor having a first terminal, a second terminal, and a gate;
   a current sense element coupled to the switching transistor;
   a blanking circuit for generating a blanking delay of a predetermined time period, the blanking circuit having an input coupled to the current sense element and an output;
   a comparator with a first input terminal, a second input terminal, and an output, the first input terminal coupled to the output of the blanking circuit and the second input terminal coupled to a reference voltage, wherein the output indicates whether the voltage of the output of the blanking circuit exceeds the reference voltage;
   a gate driver with an input coupled to the output of the comparator and with an output coupled to a gate of the transistor, wherein the output of the gate driver turns on the transistor during normal operation and turns off the transistor during a mode to determine whether a fault exists in the transistor; and
   a logic gate for receiving the output of the comparator and the output of the gate driver, wherein the logic gate outputs a signal indicating a fault condition in the transistor.

8. The circuit of claim 7, wherein the fault condition is a short circuit failure of the transistor.

9. The protection circuit of claim 7, wherein the logic gate is an AND gate comprising:
   an inverting input for receiving the output of the gate driver; and
   a non-inverting input for receiving the output of the comparator.

10. The protection circuit of claim 8, wherein the logic gate is an AND gate comprising:
    an inverting input for receiving the output of the gate driver; and
    a non-inverting input for receiving the output of the comparator.

* * * * *